(12) United States Patent
Di Stefano et al.

(10) Patent No.: US 8,348,252 B2
(45) Date of Patent: Jan. 8, 2013

(54) METHOD AND APPARATUS FOR ALIGNING AND/OR LEVELING A TEST HEAD

(75) Inventors: Thomas H. Di Stefano, Monte Sereno, CA (US); Peter T. Di Stefano, San Jose, CA (US)

(73) Assignee: Centipede Systems, Inc., San Jose, CA (US)

( * ) Notice: Subject to any disclaimer, the term of this patent is extended or adjusted under 35 U.S.C. 154(b) by 316 days.

(21) Appl. No.: 12/797,477

(22) Filed: Jun. 9, 2010

(65) Prior Publication Data

US 2010/0243071 A1 Sep. 30, 2010

Related U.S. Application Data

(62) Division of application No. 11/708,517, filed on Feb. 20, 2007, now Pat. No. 7,764,076.

(51) Int. Cl.
*B23Q 3/18* (2006.01)
*G01M 99/00* (2011.01)
*G01R 31/00* (2006.01)

(52) U.S. Cl. ........ 269/24; 73/1.01; 269/22; 324/750.16; 324/750.19; 324/750.25

(58) Field of Classification Search .............. 29/407.09, 29/759; 73/1.01; 137/15.01; 269/20, 22, 269/24; 324/750.16, 750.19, 750.25, 756.01, 324/FOR. 108
See application file for complete search history.

(56) References Cited

U.S. PATENT DOCUMENTS

| | | | |
|---|---|---|---|
| 3,023,608 A | | 3/1962 | McConnell |
| 3,291,321 A | * | 12/1966 | Hamilton ..................... 269/24 X |
| 3,466,055 A | * | 9/1969 | Keijzer ..................... 280/5.507 |
| 3,485,357 A | | 12/1969 | Payne |
| 3,826,126 A | | 7/1974 | Yasuhiro |
| 3,942,778 A | | 3/1976 | Fadiga et al. |
| 3,996,517 A | | 12/1976 | Fergason et al. |
| 4,157,066 A | | 6/1979 | Pretty |
| 4,240,778 A | | 12/1980 | Korytko |
| 4,427,250 A | | 1/1984 | Hines et al. |
| 4,515,551 A | | 5/1985 | Korytko |
| 4,660,294 A | | 4/1987 | Schmidt |

(Continued)

FOREIGN PATENT DOCUMENTS

CA 2322916 A1 * 4/2002

(Continued)

*Primary Examiner* — Thomas P Noland

(74) *Attorney, Agent, or Firm* — Michael B. Einschlag

(57) ABSTRACT

One embodiment of the present invention is a method for aligning a first workpiece to a second work piece that includes: (a) placing the first workpiece on an alignment apparatus including: (i) two or more fluid chambers disposed in fixed relation to each other, the chambers having a movable wall and one or more apertures for admitting or releasing fluid; (ii) fluid channels coupled to the one or more apertures that enable fluid to flow between at least two of the fluid chambers; and (iii) one or more valves disposed to enable or to stop the flow of fluid through one or more of the one or more fluid channels; (b) pumping incompressible fluid into the fluid chambers; (c) opening the one or more valves; (d) bringing the first and second workpieces into contact; (e) waiting a predetermined time for fluid flow in the fluid channels; (f) determining whether the first and second workpieces are aligned; (g) if they are aligned, shutting the valves; and (h) if they are not aligned, moving the second workpiece a predetermined amount in a predetermined direction, and returning to waiting.

15 Claims, 11 Drawing Sheets

U.S. PATENT DOCUMENTS

| | | | |
|---|---|---|---|
| 4,751,457 A | 6/1988 | Veenendaal | |
| 4,784,058 A | 11/1988 | Nakagawa et al. | |
| 4,820,976 A | 4/1989 | Brown | |
| 4,850,104 A * | 7/1989 | Matrone et al. | 29/829 |
| 4,852,392 A | 8/1989 | Evans | |
| 4,906,920 A | 3/1990 | Huff et al. | |
| 4,912,399 A | 3/1990 | Greub et al. | |
| 4,918,383 A | 4/1990 | Huff et al. | |
| 4,929,893 A | 5/1990 | Sato et al. | |
| 4,943,767 A | 7/1990 | Yokota | |
| 4,968,931 A | 11/1990 | Littlebury et al. | |
| 4,975,638 A | 12/1990 | Evans et al. | |
| 4,980,637 A | 12/1990 | Huff et al. | |
| 5,079,501 A | 1/1992 | Miller et al. | |
| 5,148,103 A | 9/1992 | Pasiecznik, Jr. | |
| 5,153,504 A * | 10/1992 | Bonnet et al. | 324/756.01 |
| 5,180,977 A | 1/1993 | Huff | |
| 5,220,277 A | 6/1993 | Reitinger | |
| 5,285,678 A | 2/1994 | McDaniel et al. | |
| 5,320,047 A | 6/1994 | Deurloo et al. | |
| 5,336,992 A | 8/1994 | Sato et al. | |
| 5,394,100 A | 2/1995 | Bohler et al. | |
| 5,410,259 A | 4/1995 | Fujihara et al. | |
| 5,436,568 A | 7/1995 | Woith | |
| 5,461,328 A | 10/1995 | Devereaux et al. | |
| 5,479,109 A | 12/1995 | Lau et al. | |
| 5,520,053 A | 5/1996 | Weber et al. | |
| 5,532,609 A | 7/1996 | Harwood et al. | |
| 5,550,482 A | 8/1996 | Sano | |
| 5,559,446 A | 9/1996 | Sano | |
| 5,570,032 A | 10/1996 | Atkins et al. | |
| 5,623,214 A | 4/1997 | Pasiecznik, Jr. | |
| 5,634,398 A | 6/1997 | McGee et al. | |
| 5,642,054 A | 6/1997 | Pasiecznik, Jr. | |
| 5,661,565 A * | 8/1997 | Bornhorst et al. | 358/3.32 |
| 5,663,654 A | 9/1997 | Wood et al. | |
| 5,682,062 A | 10/1997 | Gaul | |
| 5,726,580 A | 3/1998 | Wood et al. | |
| 5,735,201 A | 4/1998 | Hirao et al. | |
| 5,795,134 A * | 8/1998 | Malecha | 417/44.9 |
| 5,798,565 A | 8/1998 | Atkins et al. | |
| 5,804,983 A | 9/1998 | Nakajima et al. | |
| 5,847,571 A | 12/1998 | Liu et al. | |
| 5,859,539 A | 1/1999 | Wood et al. | |
| 5,861,759 A | 1/1999 | Bialobrodski et al. | |
| 5,869,974 A | 2/1999 | Akram et al. | |
| 5,872,459 A | 2/1999 | Pasiecznik, Jr. | |
| 5,905,382 A | 5/1999 | Wood et al. | |
| 6,060,891 A | 5/2000 | Hembree et al. | |
| 6,072,321 A | 6/2000 | Akram et al. | |
| 6,253,672 B1 | 7/2001 | Rauf et al. | |
| 6,275,052 B1 | 8/2001 | Hembree et al. | |
| 6,320,372 B1 | 11/2001 | Keller | |
| 6,342,788 B1 * | 1/2002 | McAllister et al. | 324/750.25 X |
| 6,426,499 B1 * | 7/2002 | Koops | 850/41 |
| 6,441,607 B1 | 8/2002 | Buermann et al. | 324/750.19 |
| 6,483,328 B1 | 11/2002 | Eldridge et al. | |
| 6,526,879 B1 * | 3/2003 | Mahoney | 100/46 |
| 6,551,122 B2 | 4/2003 | Bosy et al. | |
| 6,634,205 B2 | 10/2003 | Yashima et al. | |
| 6,650,135 B1 | 11/2003 | Mautz et al. | |
| 6,670,818 B1 | 12/2003 | Hembree | |
| 6,674,627 B1 | 1/2004 | Kund | |
| 6,774,651 B1 | 8/2004 | Hembree | |
| 6,965,226 B2 | 11/2005 | Dunklee | |
| 7,002,363 B2 | 2/2006 | Mathieu | |
| 7,053,648 B2 | 5/2006 | DeVey | |
| 7,068,056 B1 | 6/2006 | Gibbs et al. | |
| 7,191,512 B2 * | 3/2007 | Girard et al. | 29/759 |
| 7,235,964 B2 | 6/2007 | Mueller | |
| 7,382,145 B2 | 6/2008 | Thurmaier | |
| 7,870,800 B2 * | 1/2011 | Di Stefano et al. | 73/866.5 |
| 2002/0168255 A1 * | 11/2002 | Kish | 414/401 |
| 2006/0290367 A1 | 12/2006 | Hobbs et al. | |
| 2008/0122432 A1 * | 5/2008 | Mueller | 324/158.1 |

FOREIGN PATENT DOCUMENTS

| | | | |
|---|---|---|---|
| DE | 4242102 A1 * | 12/1993 | 228/47.1 |
| DE | 4434100 C1 * | 5/1996 | |
| EP | 0331282 B1 | 10/1993 | |
| GB | 2050937 A * | 1/1981 | 83/FOR. 100 |
| JP | 58107290 A * | 6/1983 | 228/2.3 |
| SU | 1516300 A * | 10/1989 | |
| WO | WO 96/15458 A1 | 5/1996 | |
| WO | WO 9626843 A1 * | 9/1996 | |
| WO | WO0033096 A1 | 6/2000 | |

* cited by examiner

SECTION A-A'

SECTION B-B'

SECTION E-E'

METHOD AND APPARATUS FOR ALIGNING AND/OR LEVELING A TEST HEAD

This patent application is a divisional of a U.S. patent application having Ser. No. 11/708,517 that was filed on Feb. 20, 2007, which U.S. patent application is incorporated herein in its entirety.

TECHNICAL FIELD OF THE INVENTION

One or more embodiments of the present invention relate to method and apparatus for aligning and leveling a test head.

BACKGROUND OF THE INVENTION

Semiconductor components are used in the fabrication of electronic items such as multichip modules. For example, bare semiconductor dice can be mounted to substrates such as printed circuit boards, and ceramic interposers. Flip chip mounting of bumped dice is one method for electrically connecting the dice to the substrates. With flip chip mounting, solder bumps on the device bond pads are reflowed into electrical contact with contacts on the substrate. Chip on board (COB) mounting of dice to substrates can also be employed. With chip on board mounting, wire bonds are formed between the device bond pads and contacts on the substrate.

Chip scale packages are sometimes used in place of bare dice for fabricating electronic items. Typically, a chip scale package includes a substrate bonded to the face of a bare die. The substrate includes external contacts for making outside electrical connections to the chip scale package. The external contacts for one type of chip scale package include solder balls arranged in a dense array such as a ball grid array (BGA) or a fine ball grid array (FBGA). In general, chip scale packages can be mounted to substrates using the same mounting methods employed with bare dice.

Besides making permanent electrical connections between semiconductor components and substrates for fabricating multichip modules or other packaging applications, electrical connections are necessary for testing applications. For example, bare dice are tested in the manufacture of known good dice (KGD). Chip scale packages must also be tested prior to use in electronic items. In these cases, electrical connections with device bond pads for bare dice, or with the external contacts for chip scale packages, are typically non-bonded, temporary electrical connections.

In either packaging or testing applications, a substrate includes contacts that must be physically aligned with, and then electrically connected to, corresponding contacts on a component. As semiconductor components become smaller, and contacts become denser, aligning and electrically connecting components to substrates become more difficult. Accordingly, a design consideration in packaging and testing of semiconductor components is a method for aligning and connecting components to mating substrates.

As such, one such problem facing the semiconductor industry is how to planarize a probe card to a wafer during testing of individual die on that wafer. During probe testing a probe card must be aligned and placed in electrical contact with a wafer. When the wafer and probe card are moved together in a vertical direction, contacts on the wafer may not always engage contacts on the probe card along the same plane. Such misalignment can cause pivoting of the wafer or the probe card. Also, the potential of misalignment can require overdriving the wafer or the probe card in the vertical direction to make reliable electrically connections. This overdrive can damage contacts. In addition, if planarization is not achieved, then some probes may apply more pressure to corresponding lead pads on a die, while others may apply less. This could result in incomplete electrical interfacing with the die so that the die tests bad, or that the lead pads to which more pressure is applied are physically damaged—thereby making it impossible to use the die in a finished product. Further, as the number of probes is increased in probe apparatus, tilting becomes more of a problem.

Besides the above examples, alignment problems can occur in other semiconductor packaging or assembly processes such as wire bonding and adhesive bonding of dice to leadframes. Another manufacturing process involving alignment occurs during fabrication of flat panel field emission displays (FEDs). An individual field emission display pixel includes emitter sites formed on a baseplate. Electrons emitted by the emitter sites strike phosphors contained on a display screen to form an image. During fabrication of the field emission display it is necessary to align the baseplate with the display screen. However, field emission displays are typically constructed as a sealed package with a vacuum space between the baseplate and the display screen. This space complicates the alignment procedure because most alignment devices, such as aligner bonder tools, are constructed to bring the mating components into physical contact.

A need for alignment of a platen also arises in industries unrelated to semiconductor testing; most importantly, in metal stamping and in printing. The forces involved in these applications are relatively large in comparison to the forces involved in testing a semiconductor wafer, for example. Hydraulic cylinders have been used in various configurations to support and level a platen involved in metal stamping and printing. Generally, the one or more hydraulic cylinders supporting a platen are relatively long, with a stroke that is comparable to or larger than the bore. At the high forces and hydraulic pressures involved in these applications, compressibility of the hydraulic fluid is a significant factor in determining the position and movement of the platen as the press is actuated. Compression of the hydraulic fluid in supporting hydraulic cylinders is used as a cushion in high force presses that helps to level the loading of the press. As the influence of compressibility of the hydraulic fluid increases with length of the cylinder, a long hydraulic cylinder is used to provide cushioning that acts to level the platen under force. In certain configurations of the prior art, fluid is allowed to flow between hydraulic cylinders in a press in order to level the load. However, because of the length of the hydraulic cylinders used in presses, the cylinders are not an accurate method of setting the height of the platen. More accurate means are needed to set and maintain alignment that are not sensitive to pressure, temperature, and loading.

In light of the above, there is a need in the art for method and apparatus that can align and level a substrate and a test head or electronic components.

SUMMARY OF THE INVENTION

One or more embodiments of the present invention satisfy one or more of the above-identified needs. In particular, one embodiment of the present invention is a method for aligning a first workpiece to a second work piece that comprises: (a) placing the first workpiece on an alignment apparatus comprising: (i) two or more fluid chambers disposed in fixed relation to each other, the chambers having a movable wall and one or more apertures for admitting or releasing fluid; (ii) fluid channels coupled to the one or more apertures that enable fluid to flow between at least two of the fluid chambers;

and (iii) one or more valves disposed to enable or to stop the flow of fluid through one or more of the one or more fluid channels; (b) pumping incompressible fluid into the fluid chambers; (c) opening the one or more valves; (d) bringing the first and second workpieces into contact; (e) waiting a predetermined time for fluid flow in the fluid channels; (f) determining whether the first and second workpieces are aligned; (g) if they are aligned, shutting the valves; and (h) if they are not aligned, moving the second workpiece a predetermined amount in a predetermined direction, and returning to waiting.

DETAILED DESCRIPTION

Figure 1A:
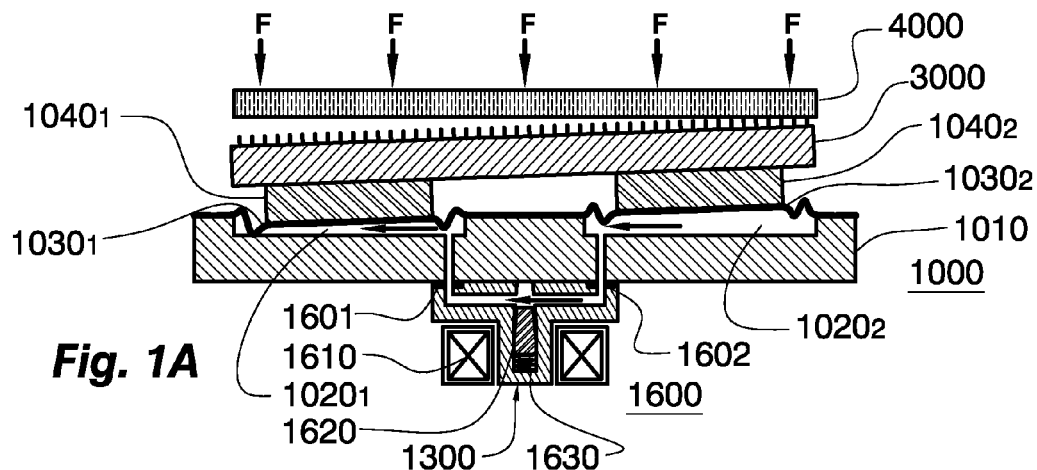
FIG. 1A shows a cross-sectional view of an alignment apparatus that is fabricated in accordance with one or more embodiments of the present invention, the alignment apparatus is shown prior to alignment of a test head with a wafer.

FIG. 1A shows a cross-sectional view of alignment apparatus 1000 that is fabricated in accordance with one or more embodiments of the present invention. In accordance with one or more such embodiments, alignment apparatus 1000 may be utilized, for example and without limitation, as an apparatus for aligning a test head such as, for example and without limitation, a wafer probe test head, a thermal contactor test head, a mechanical measurement test head, an optical test head, an array of electrical contacts test head, and a multiplicity of any of such test heads.

Figure 1B:
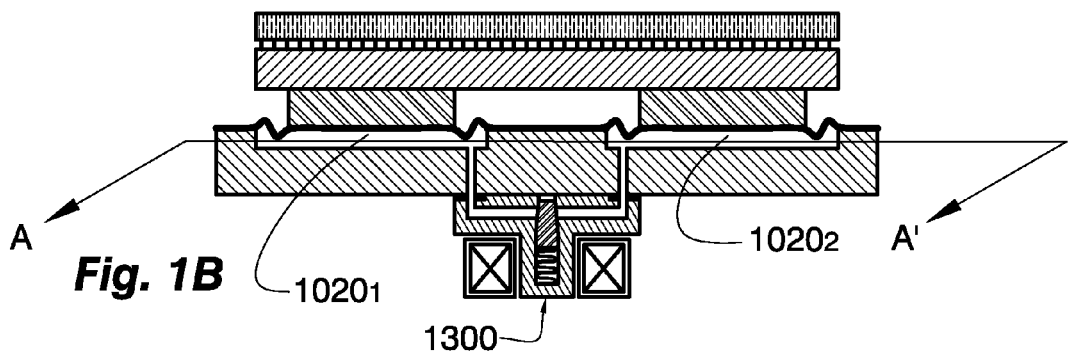
FIG. 1B shows a cross-sectional view of the alignment apparatus shown in FIG. 1A in use after alignment of the test head with the wafer.
Figure 1C:
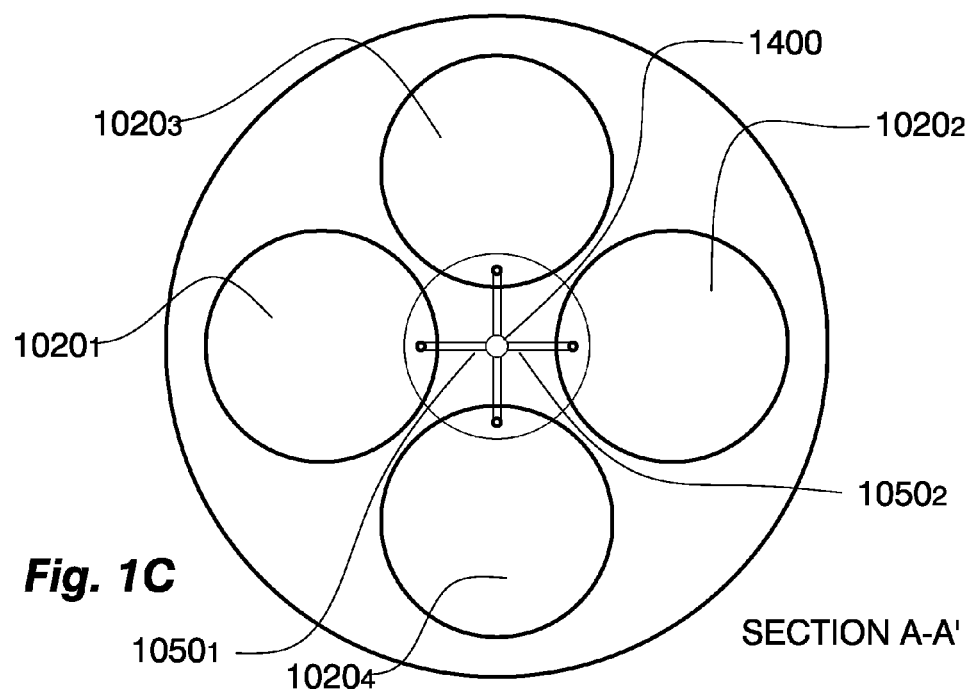
FIG. 1C shows a top sectional view of the alignment apparatus shown in FIG. 1A, which section is taken in a plane indicated by arrows A and A' of FIG. 1B.

As shown in FIG. 1, alignment apparatus 1000 comprises support plate 1010 in which a multiplicity of reservoirs or chambers, for example and without limitation, four reservoirs $1020_1$-$1020_4$ are arrayed (reservoirs $1020_1$-$1020_4$ are seen in FIG. 1C, and a cross-section of reservoirs $1020_1$-$1020_2$ is seen in FIGS. 1A and 1B). As shown in FIG. 1C, and in accordance with one or more embodiments of the present invention, reservoirs $1020_1$-$1020_4$ are arrayed in a fixed relationship with respect to each other. In particular, reservoirs $1020_1$-$1020_4$ are disposed symmetrically about vertical central axis 1300 of support plate 1010. In addition, and in accordance with one or more such embodiments of the present invention, reservoirs $1020_1$-$1020_4$ are arrayed in a plane on support plate 1010.

In accordance with one or more embodiments of the present invention, each of reservoirs $1020_1$-$1020_4$ includes a bottom surface and a top surface (top surfaces $1030_1$-$1030_2$ are shown in FIG. 1A) that includes a movable portion. In accordance with one or more such embodiments, top surfaces $1030_1$-$1030_2$ are movable and include diaphragms made, for example and without limitation, of thin embossed sheets of type 316L stainless steel. Further, in accordance with one or more such embodiments, one or more pillars are mechanically connected (for example and without limitation, rigidly connected) to top surfaces $1030_1$-$1030_2$ of reservoirs $1020_1$-$1020_2$ (as shown in FIG. 1A, pillars $1040_1$-$1040_2$ are mechanically connected to top surfaces $1030_1$-$1030_2$). In accordance with one or more such embodiments, pillars $1040_1$-$1040_2$ may be any suitable material such as, for example and without limitation, a metal such as type 304 stainless steel, hardened tool steel, titanium, and the like. Pillars $1040_1$-$1040_2$ support test head 3000, and thereby, determine its orientation with respect to support plate 1010. In accordance with one or more embodiments of the present invention, pillars $1040_1$-$1040_2$ may be attached to top surfaces $1030_1$-$1030_2$ by means of, for example and without limitation, mechanical fasteners, posts, magnetic force, adhesives, or vacuum.

FIG. 1C shows a top sectional view of alignment apparatus 1000, which section is taken in a plane indicated by arrows A and A' of FIG. 1B. As shown in FIG. 1C, and in accordance with one or more embodiments of the present invention, each of reservoirs $1020_1$-$1020_4$ has an aperture that admits and releases fluid, which apertures are connected to fluid channels that are interconnected at junction 1400. Thus, in accordance with one or more such embodiments, as shown in FIG. 1A, fluid may flow: (a) from reservoir $1020_2$, through the aperture therein; (b) through fluid channel $1050_2$; (c) past junction 1400; (d) through fluid channel $1050_1$; and (e) into reservoir $1020_1$, through the aperture therein. In addition, as shown in FIGS. 1A and 1B, and in accordance with one or more embodiments of the present invention, alignment apparatus 1000 includes valve mechanism 1600 (for example and without limitation, a solenoid-operated, spring-return valve) that is adapted to stop the flow of fluid in alignment apparatus 1000. In particular, as shown in FIGS. 1A and 1B, valve mechanism 1600 is affixed to support plate 1010 by screws (not shown), and sealed against fluid leaks by O-rings 1601 and 1602. Valve mechanism 1600 includes plug 1620 which is urged upward in a vertical direction by spring 1630, and may be urged in a downward vertical direction by activation of electromagnet 1610 by a controller (not shown). Such a controller may be fabricated readily by one of ordinary skill in the art utilizing, for example and without limitation, any one of a number of commercially available programmable microprocessors, which microprocessors may be programmed routinely and without undue experimentation utilizing any one of a number of methods that are also well known to those of ordinary skill in the art. In accordance with one or more such embodiments, plug 1620 may be one or more of a metal, a plastic-coated ferromagnetic metal impregnated plastic, a glass-filled PTFE polymer, a PEEK polymer, a PFA-coated alnico magnet, and so forth. In accordance with one or more embodiments of the present invention, plug 1620 may have a relief hole along an axis through the plug which is designed to allow fluid flow from a top cavity to a bottom cavity in which plug 1620 moves in an upward and downward motion.

In accordance with one or more embodiments of the present invention, the fluid used in alignment apparatus 1000 may be a gas or a liquid such as, for example and without limitation, a hydraulic fluid. More preferably, the fluid is a relatively incompressible liquid such as, for example and without limitation, silicone vacuum pump oil, aliphatic oil, and various hydraulic fluids.

In addition, in accordance with one or more embodiments of the present invention, alignment apparatus 1000 includes a pump (not shown) to pump fluid into reservoirs $1020_1$-$1020_4$ from a fluid reservoir (not shown). Such a fluid replenishment system may further include a pressure relief valve and a check valve. The pressure relief valve ensures that any excess fluid pressure is returned to the system fluid reservoir. In accordance with one or more embodiments of the present invention, the pump may be any suitable pump such as, for example and without limitation, a piezoelectric pump, a peristaltic pump, or a contraction of a bladder. In accordance with one or more such embodiments, the pump may pump fluid into a fluid channel at common junction 1400 or into any of the fluid channels individually. Alternatively, each of chambers $1020_1$-$1020_4$ may be connected to a fluid reservoir.

In accordance with one or more embodiments of the present invention, a volume, including a cross sectional area and height of a reservoir may be determined routinely and without undue experimentation by one of ordinary skill in the art in light of a particular application taking into account one or more of the following: a force needed to be applied (for example to engage a test head with a wafer); a predetermined time for fluid to flow among the reservoirs; and a viscosity of the fluid utilized.

Figure 2A:
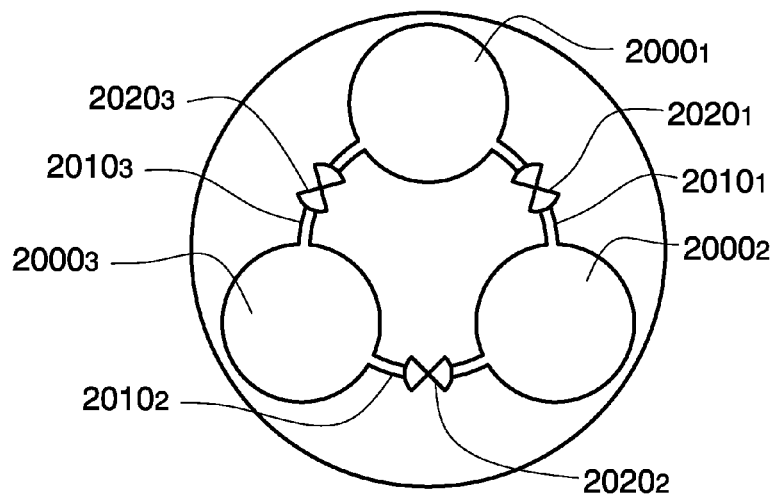
FIGS. 2A-2C show top views of alignment apparatus that are fabricated in accordance with one or more embodiments of the present invention.
Figure 2B:
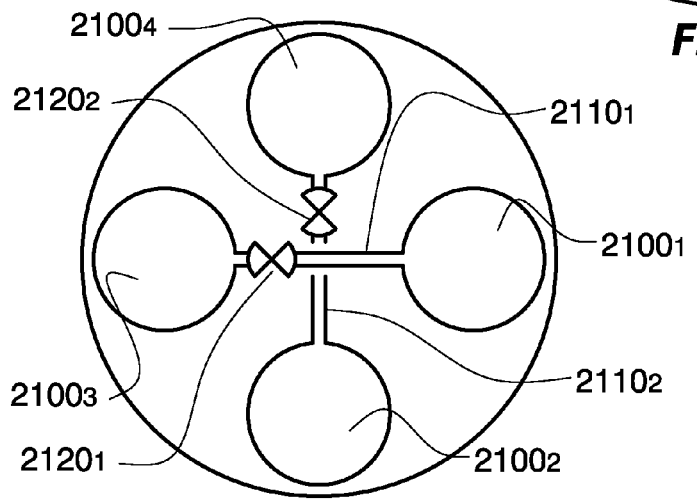
Figure 2C:
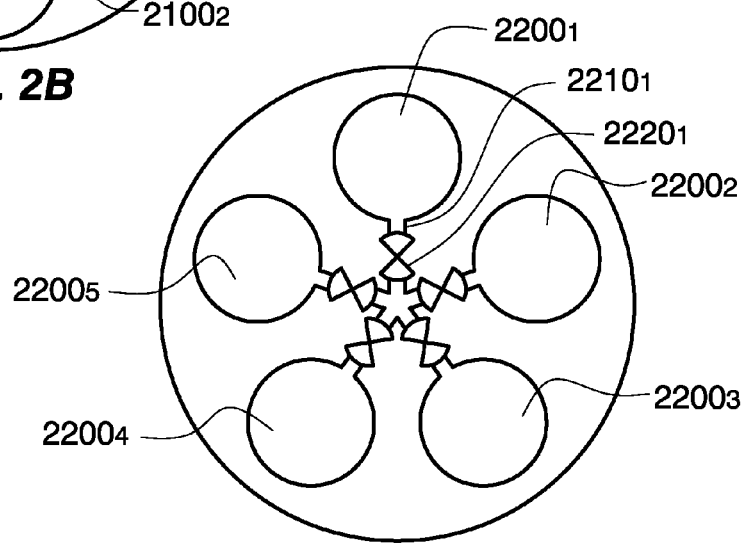

FIGS. 2A-2C show top sectional views of alignment apparatus that are fabricated in accordance with one or more embodiments of the present invention. FIG. 2A shows a top sectional view of an embodiment of the present invention which comprises three reservoirs $2000_1$-$2000_3$ wherein: fluid channel $2010_1$ having valve $2020_1$ is connected between reservoirs $2000_1$ and $2000_2$; fluid channel $2010_2$ having valve $2020_2$ is connected between reservoirs $2000_2$ and $2000_3$; and fluid channel $2010_3$ having valve $2020_3$ is connected between reservoirs $2000_3$ and $2000_1$. In accordance with such an embodiment, closure of all valves $2020_1$-$2020_3$ is required to stop the flow of fluid in the alignment apparatus. FIG. 2B shows a top sectional view of an embodiment of the present invention which comprises four reservoirs $2100_1$-$2100_4$ wherein: fluid channel $2110_1$ having valve $2120_1$ is connected between reservoirs $2100_1$ and $2100_3$; and fluid channel $2110_2$ having valve $2120_2$ is connected between reservoirs $2100_2$ and $2100_4$. In accordance with such an embodiment, closure of all valves $2120_1$-$2120_2$ is required to stop the flow of fluid in the alignment apparatus. Lastly, FIG. 2C shows a top sectional view of an embodiment of the present invention which comprises five reservoirs $2200_1$-$2200_5$ wherein: fluid channels $2210_1$-$2210_5$ having valves $2220_1$-$2220_5$, respectively, all meet at a common junction. In accordance with such an embodiment, closure of all valves $2220_1$-$2220_5$ is required to stop the flow of fluid in the alignment apparatus. Thus, as one can readily appreciate from this, embodiments of the present invention exist in many variations, for example and without limitation, an embodiment having four reservoirs where each of the four reservoirs may have fluid channels connecting each of the four reservoirs with an opposite chamber so that fluid may fluid therebetween. In addition, and in accordance with one or more such embodiments, each reservoir may connect to a fluid channel that connects each reservoir to a common point or junction. Further, in accordance with one or more such embodiments, each fluid channel may have a fluid valve that is capable of stopping a flow of liquid to or from each reservoir, and there may be a fluid valve at a common point or junction of all the fluid channels.

Referring back to FIGS. 1A-1C, in accordance with one or more further embodiments of the present invention, pillars $1040_1$-$1040_4$ are not utilized, and reservoirs $1020_1$-$1020_4$ may include bellows that protrude above the surface of support plate 1010. Further, in accordance with one or more further embodiments of the present invention, reservoirs $1020_1$-$1020_4$ may include pistons that may be activated to provide an initialization state wherein each reservoir has the same volume of fluid therein, which pistons would operate under the control of a controller (not shown). Such a controller may be fabricated readily by one of ordinary skill in the art utilizing, for example and without limitation, any one of a number of commercially available programmable microprocessors, which microprocessors may be programmed routinely and without undue experimentation utilizing any one of a number of methods that are also well known to those of ordinary skill in the art.

Figure 3:
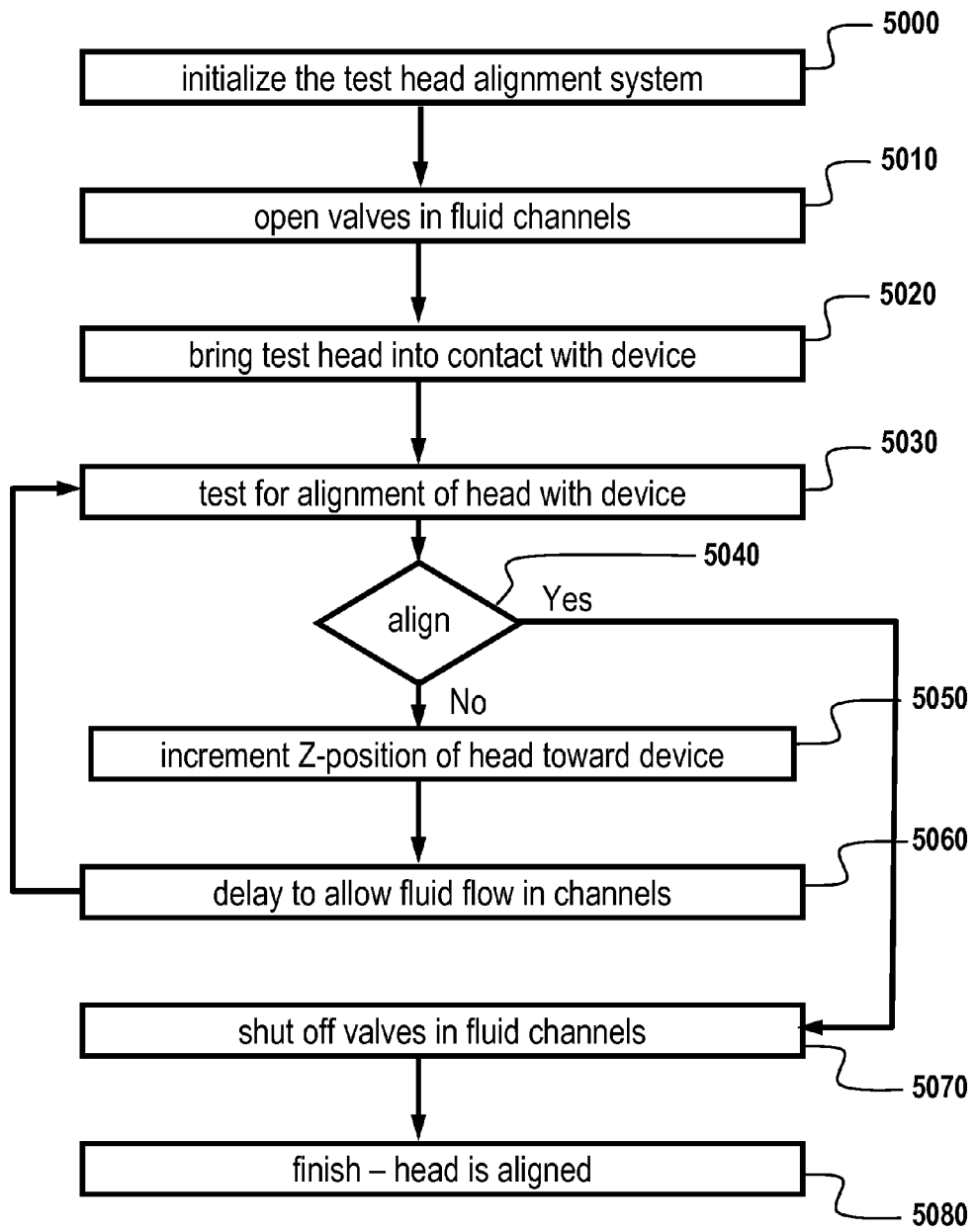
FIG. 3 shows a flow chart of a method for aligning a test head in accordance with one or more embodiments of the present invention.

FIG. 3 shows a flow chart of a method for aligning a test head in accordance with one or more embodiments of the present invention. As shown in FIG. 3, at step 5000, alignment apparatus 1000 is initialized by a controller which causes fluid to be pumped from a reservoir (not shown) into reservoirs $1020_1$-$1020_4$. Such a controller may be fabricated readily by one of ordinary skill in the art utilizing, for example and without limitation, any one of a number of commercially available programmable microprocessors, which microprocessors may be programmed routinely and without undue experimentation utilizing any one of a number of methods that are also well known to those of ordinary skill in the art. Then, control is transfer to step 5010.

At step 5010 shown in FIG. 3, the controller sends a signal that causes valve mechanism 1600 to open to enable fluid flow in fluid channels $1050_1$-$1050_4$. Then, control is transferred to step 5020.

At step 5020 shown in FIG. 3, wafer 4000 is mounted in a conventional, movable chuck (not shown) that is capable of moving in a vertical direction in response to control signals sent by the controller. Next, the controller sends a signal that causes wafer 4000 to be moved downward to touch test head 3000, as detected, for example and without limitation, by electrical contact between probes on test head 3000 and wafer 4000. The controller also delays, by a predetermined amount, to allow fluid flow in fluid channels $1050_1$-$1050_4$. Then, control is transferred to step 5030.

At step 5030 shown in FIG. 3, the controller carries out a test to determine whether wafer 4000 and test head 3000 are aligned in an orientation in which a bottom surface of wafer 4000 is parallel to a top surface of probe head 3000, such alignment test being carried out, for example and without limitation, by the controller's examining a map of electrical contacts made between an array of probes on test head 3000 and wafer 4000. Then, control is transferred to decision step 5040.

At decision step 5040, the controller determines whether wafer 4000 and test head 3000 are aligned. If they are aligned, control is transferred to step 5070, otherwise; control is transferred to step 5050.

At step 5050 shown in FIG. 3, the controller sends a signal that causes wafer 4000 to be moved downward by a predetermined amount. Then, control is transferred to step 5060.

At step 5060 shown in FIG. 3, the controller delays by a predetermined amount to allow fluid to flow in fluid channels $1050_1$-$1050_4$. Then, control is transferred to step 5030.

At step 5070, the controller sends a signal that causes valve mechanism 1600 to stop fluid flow in fluid channels $1050_1$-$1050_4$. Then, control is transferred to step 5080 where the process ends.

As one of ordinary skill in the art will readily appreciate from the above, test head 3000 may be a planar test head or test head 3000 may comprise test pins that are projected up and in a plane. In general, test head 3000 may be a first workpiece and wafer 4000 may be a second workpiece. Further, as wafer 4000 and test head 3000 are urged into contact, test head 3000 generates forces on each of reservoirs $1020_1$-$1020_4$. These forces cause fluid to flow in fluid channels $1050_1$-$1050_4$ between reservoirs $1020_1$-$1020_4$ and junction 1400. If more force is applied to one of reservoirs $1020_1$-$1020_4$ than others of reservoirs $1020_1$-$1020_4$, then fluid will flow from the one chamber to other chambers. As this occurs, the top surface of the one chamber will subside and the top surface of the other chambers will rise. The speed at which this occurs will be determined by the rate of fluid flow in fluid channels $1050_1$-$1050_4$ and the surface area of reservoir tops $1030_1$-$1030_4$. In this manner, reservoirs $1020_1$-$1020_4$ will enable test head 3000 to adjust for aplanarity of wafer 4000 or for alignment of test head 3000 with wafer 4000. When alignment has been achieved, fluid flow in the fluid channels is halted by closing the valves, thereby locking test head 3000 in a fixed orientation with respect to wafer 4000.

In accordance with one or more alternative embodiments of the present invention, test head 3000 may be leveled or aligned by applying a force to change the amount of fluid contained in one or more of reservoirs $1020_1$-$1020_4$, wherein the force may be applied using one or more of a magnetic mechanism, a pneumatic mechanism, and a spring mechanism.

Figure 4A:
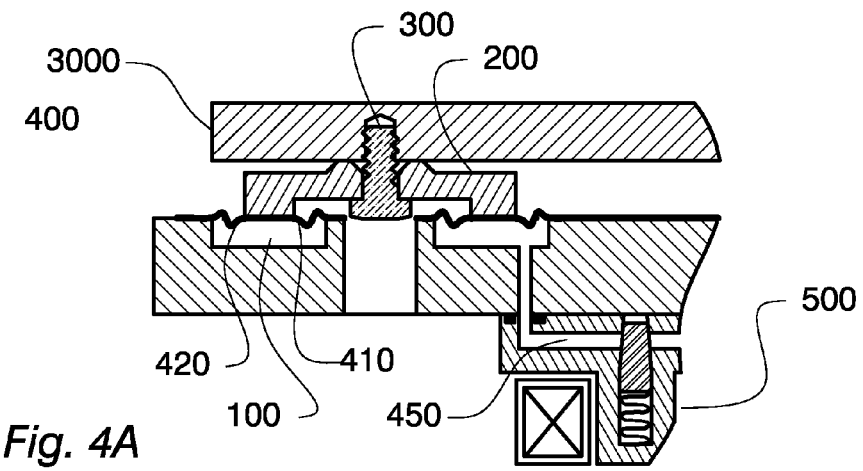
FIGS. 4A-4C show partial cross-sectional views of alternative embodiments of fluid chambers that may be used to fabricate one or more embodiments of the present invention.
Figure 4B:
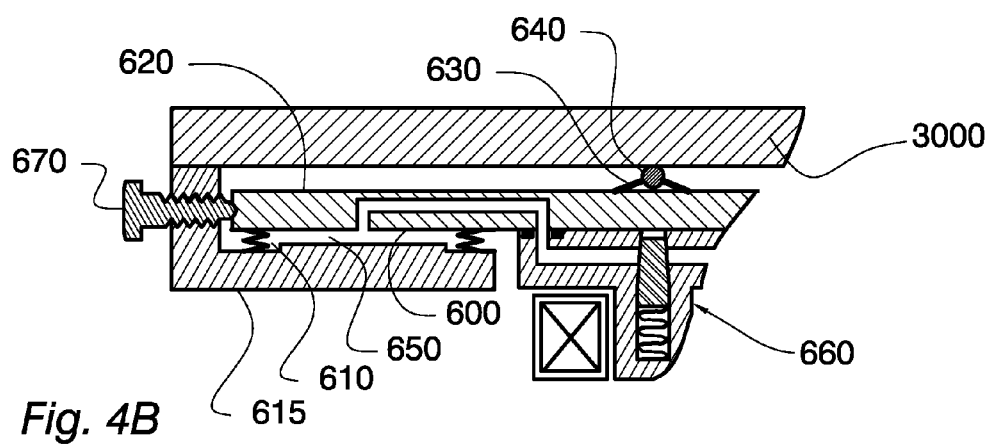
Figure 4C:
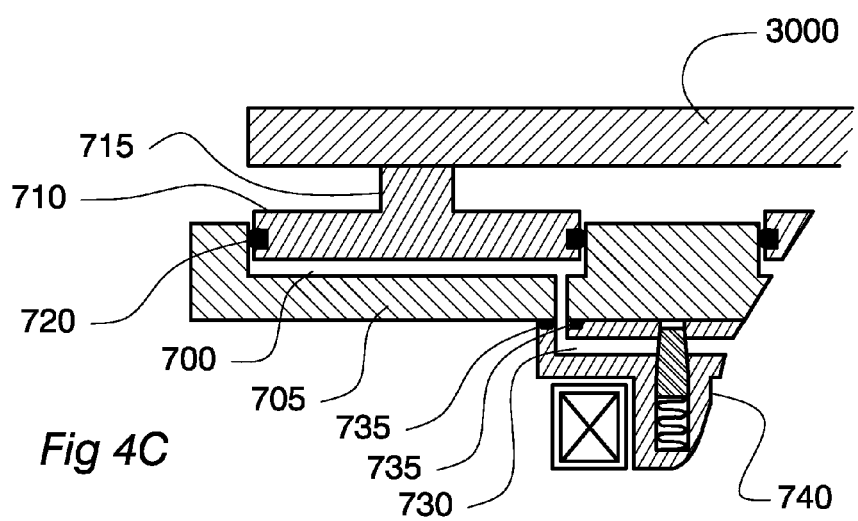

In accordance with one or more embodiments of the present invention, a fluidic chamber may be configured to have a movable side that depends upon the specific requirements of the application. By way of example, FIGS. 4A-C are partial cross-sectional views of fluidic chambers that may be used to fabricate one or more embodiments of the present invention, the fluidic chambers having different configurations. In particular, FIG. 4A shows a cross-sectional view of fluidic chamber 100 having movable pillar 200 attached to test head 3000 by means of threaded bolt 300. As shown in FIG. 4A, movable pillar 200 comprises two pillars having a bridge connecting them. As further shown in FIG. 4A, bolt 300 is attached from a bottom side of movable pillar 200 to enable easy dismounting of test head 3000 (i.e., an attachment mechanism is formed by bolt 300 being threaded through movable pillar 200 and test head 3000). As still further indicated by FIG. 4A, diaphragm 400 is an annulus attached to movable pillar 200 at an inner diameter edge and at an outer diameter edge. In addition, as shown in FIG. 4A, movable pillar 200 is attached to a top surface of diaphragm 400 on an area between undulation 410 proximal to an inner diameter of diaphragm 400 and undulation 420 proximal to an outer diameter of diaphragm 400. Fluid pressure in chamber 100 of FIG. 4A bows diaphragm 400 upward, thereby urging movable pillar 200 and attached test head 3000 in upward direction. As further shown in FIG. 4A, fluid chamber 100 is connected to shut-off valve 500 by fluid channel 450. Whenever valve 500 in fluid channel 450 is open, fluid is able to flow from annular chamber 100 to other similar fluid chambers (not shown). Whenever valve 500 is closed, as shown in FIG. 4A, fluid in annular chamber 100 is fixed, thereby holding movable pillar 200 and attached portion of test head 3000 in a fixed vertical position.

In order that the attached portion of test head 3000 be held in a fixed position that is substantially unchanged by downward pressure on test head 3000, in accordance with one or more embodiments of the present invention, fluid chamber 100 is preferably filled with a relatively incompressible fluid such as, for example and without limitation, silicone vacuum pump oil, aliphatic oil, and the like. In accordance with one or more further such embodiments, fluid chamber 100 has a height in a vertical direction that is less than a maximum diameter of fluid chamber 100 in a horizontal direction. In particular, in accordance with one or more such embodiments, fluid chamber 100 has a height in the vertical direction that is less than 10% of a maximum diameter of fluid chamber 100 in a horizontal direction, thereby reducing vertical deflection of test head 3000 due to compressibility of fluid in fluid chamber 100. Alternatively, in accordance with one or more such embodiments, fluid chamber 100 encloses a volume of fluid that is less than $\frac{1}{10}$ times an area of moveable wall 400 raised to a power 3/2.

In accordance with one or more embodiments of the present invention, test head 3000 may be supported on two or more posts that are attached directly to fluid chambers of the type (i.e., fluid chamber 100) shown in FIG. 4A. In addition, in accordance with one or more embodiments, a post supporting test head 3000 may be rigidly attached to movable pillar 200, wherein mechanical means exist for adjusting a height of the post. By way of example, and as has been described above, test head 3000 may be supported on posts including one post that has a height that is adjustable by a screw mechanism; and two or more posts (comprising legs of movable pillar 200 shown in FIG. 4A) that are each attached to a movable wall (wall 400 shown in FIG. 4A) of a fluid chamber (for example, fluid chamber 100 shown in FIG. 4A).

FIG. 4B shows a cross-sectional view of a fluidic chamber that may be used to fabricate one or more embodiments of the present invention, which fluidic chamber enables positioning of a test head in a horizontal plane as well as leveling in a vertical direction. As shown in FIG. 4B, fluid chamber 650 is formed by horizontal support plate 600, expandable bellows structure 610, plate 620, and movable plate 615 which is affixed to test head 3000. In accordance with one or more such embodiments of the present invention, expandable bellows structure 610 enables movable plate 615 to have a limited amount of movement in a horizontal direction as well as in a vertical direction. As further shown in FIG. 4B, test head 3000 is urged upwardly by a force generator comprising Belleville spring 630 that thrusts ball 640 against a center portion of test head 3000. In operation, Belleville spring 630 is initially put in a tensioned state by introducing fluid under pressure from an external source (not shown) into the fluid chambers, including fluid chamber 650 shown in FIG. 4B, that support test head 3000, thereby urging movable plate 615 and attached test head 3000 in a downward direction. After the initial tensioning of Belleville spring 630, the external source of fluid pressure is sealed off from a network of fluid channels connecting the fluid chambers, i.e., the network is thereby made closed. Then, test head 3000 shown in FIG. 4B is aligned as described above in conjunction with FIG. 1A. In particular, the fluid valve or valves in channels connecting the chambers is opened (for example, valve 660 shown in FIG. 4B), and a test piece is urged downwardly against test head 3000, thereby causing fluid to flow in channels interconnecting the fluid chambers to enable test head 3000 to come into parallel registration with respect to the test piece. The valve or valves in the fluid channels (for example, valve 660 shown in FIG. 4B) are closed when test head 3000 is in registration with the test piece, as determined, for example and without limitation, by electrical contact patterns, by interferometer measurements, by optical measurements, or by use of any other means that are well known by one of ordinary skill in the art. After the valves are closed, an upward force of Belleville spring 630 on test head 3000 urges movable plate 615 upward in a vertical direction, thereby maintaining a positive fluid pressure in the chambers. It will be understood by one of ordinary skill in the art that a negative fluid pressure in the fluid chambers may also be used, wherein a spring or other mechanical force generator is employed to urge test head 3000 downward toward support plate 620, thereby urging movable plate 615 downward and bellows structure 610 to expand downwardly.

In accordance with one or more embodiments of the present invention, and as indicated in FIG. 4B, test head 3000 is aligned in a first horizontal direction by alignment screw 670 that urges test head 3000 horizontally toward the right. Other alignment screws (not visible in FIG. 4B) urge test head 3000 in a second horizontal direction, preferably orthogonal to the first direction, and thereby may be used to urge test head 3000 in a rotational direction around a vertical axis. In accordance with one or more such embodiments, bellows structure 610 of each fluid chamber is sufficiently flexible to allow horizontal movement necessary to align test head 3000 in a desired horizontal direction.

FIG. 4C shows a cross-sectional view of fluidic chamber 700 that may be used to fabricate one or more embodiments of the present invention. As shown in FIG. 4C, chamber 700 includes movable piston 710 that is sealed at a perimeter of chamber 700 by O-ring 720. Further, piston 710 includes post 715 which supports test head 3000. In accordance with one or more embodiments of the present invention, test head 3000 may rest on post 715 or it may be connected thereto, for example and without limitation, by adhesives. As further shown in FIG. 4C, fluid channel 730 passes through solenoid-operated, spring-return valve 740 (shown in a closed position in FIG. 4C), where solenoid-operated, spring-return valve 740 is sealed to support plate 705 by O-rings 735 using, for example and without limitation, screws (not shown).

Figure 5A:
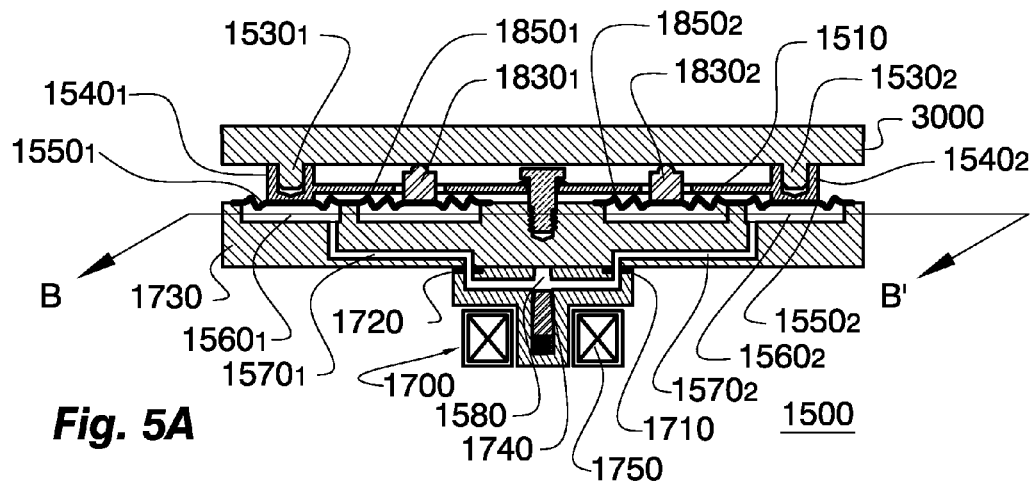
FIGS. 5A-5B show a cross-sectional view and a top sectional view, respectively, of an alignment and leveling apparatus that is fabricated in accordance with one or more embodiments of the present invention in which pneumatic actuators are used to level a test head.

One or more embodiments of the present invention are capable of aligning a test head to be parallel to a test piece without the need for contact therebetween. In order to do this, a test head is connected to movable walls of fluid chambers while fluid is able to flow in channels interconnecting the fluid chambers. Then, a force is applied to the test head using, for example and without limitation, pneumatic actuators, springs, electromagnetic actuators, magnets, and hydraulic actuators. In accordance with one or more such embodiments, the force acts to change an orientation of the test head. FIG. 5A shows a cross-sectional view of alignment and leveling apparatus 1500 that is fabricated in accordance with one or more embodiments of the present invention wherein pneumatic actuators are used to align a test head. In accordance with one or more such embodiments, alignment and leveling apparatus 1500 may be utilized to level a test head and to align it to a horizontal orientation.

Figure 5B:
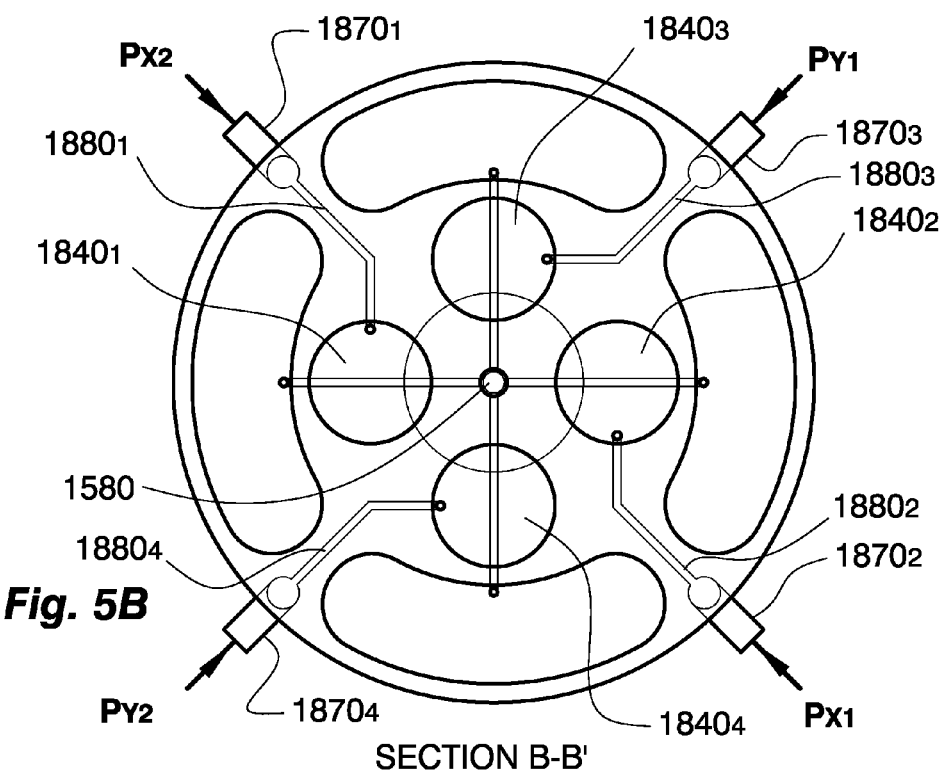
Figure 6A:
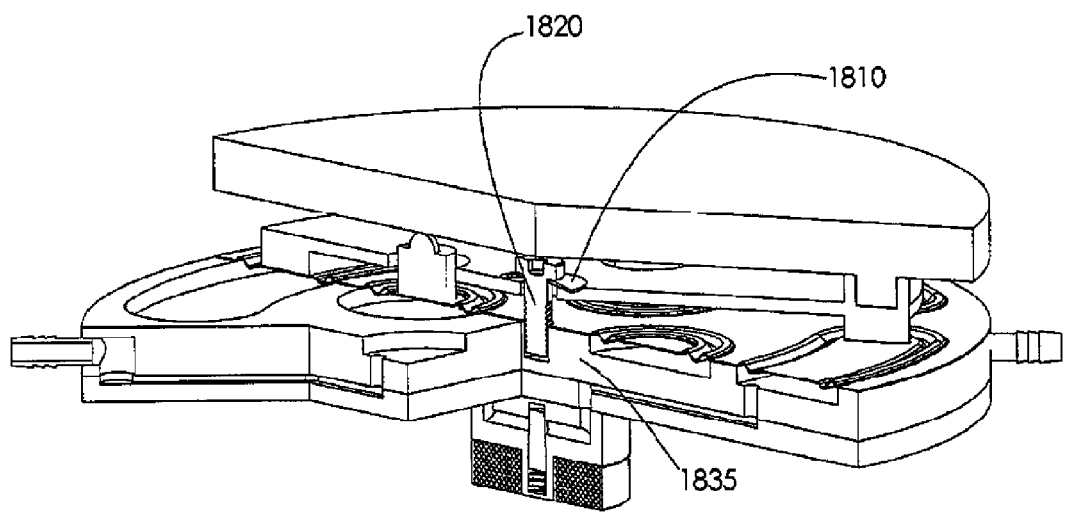
FIG. 6A shows a sectional perspective view of the alignment and leveling apparatus shown in FIG. 5A.
Figure 6B:
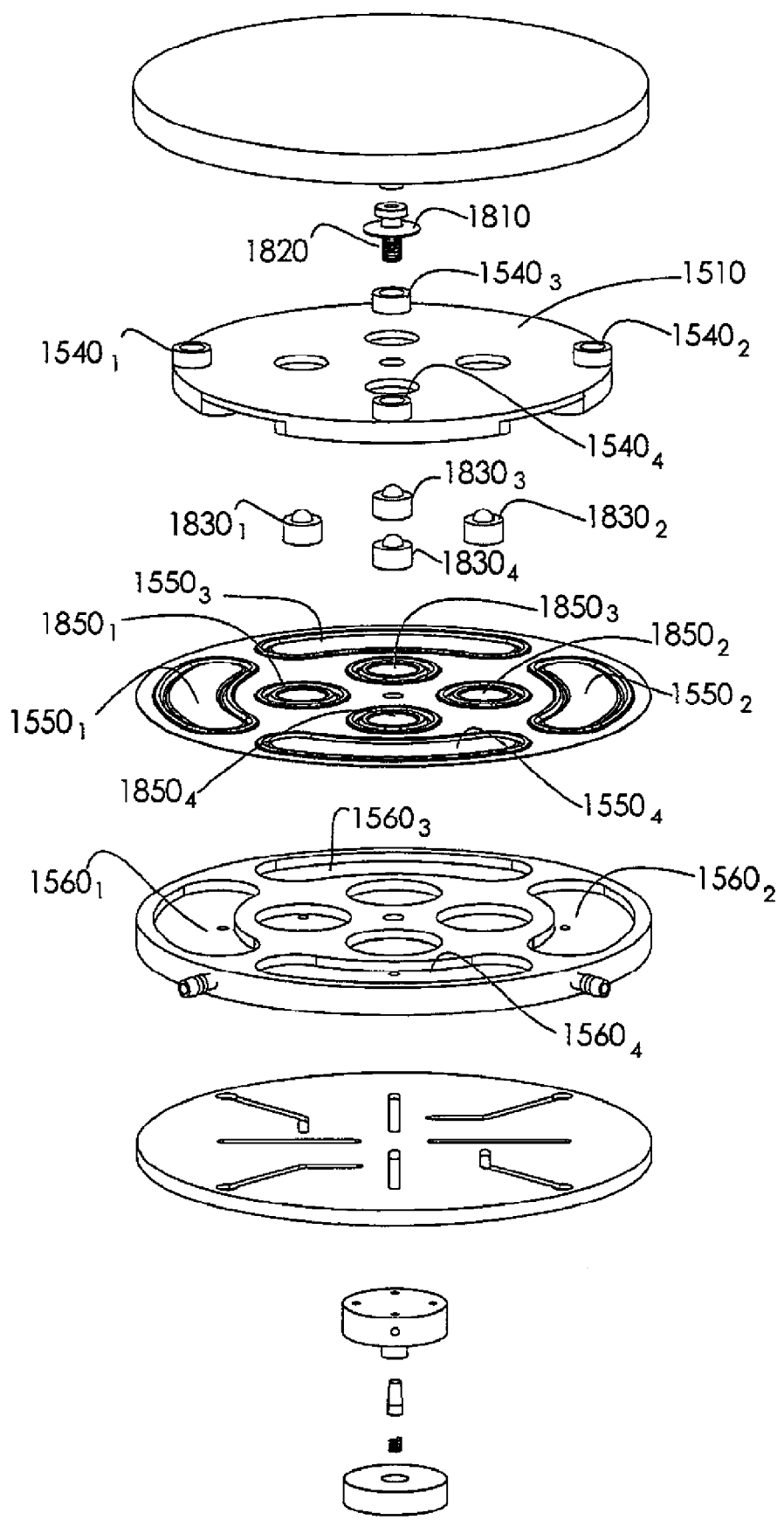
FIG. 6B shows an exploded assembly view, in perspective, of the alignment and leveling apparatus shown in FIG. 5A.

FIG. 5A shows a cross-sectional view of alignment and leveling apparatus 1500; FIG. 5B shows a top sectional view of alignment and leveling apparatus 1500 where the section is taken in a plane indicated by arrows B and B' of FIG. 5B; FIG. 6A shows a sectional perspective view of alignment and leveling apparatus 1500; and FIG. 6B shows an exploded assembly view in perspective of alignment and leveling apparatus 1500.

In accordance with one or more embodiments of the invention, test head 3000 is supported on four studs $1530_1$-$1530_4$ that are aligned in predetermined directions along an x-axis and a y-axis (studs $1530_1$-$1530_2$ are shown in FIG. 5A). Each of four studs $1530_1$-$1530_4$ is held in a corresponding post (posts $1540_1$-$1540_2$ are shown in FIG. 5A, and posts $1540_1$-$1540_4$ are shown in FIG. 6B) attached to spider plate 1510 that spans the distance between posts $1540_1$-$1540_4$ and links posts $1540_1$-$1540_4$ together. In accordance with one or more such embodiments, each of studs $1530_1$-$1530_4$ is held fast within a hole in a corresponding post and is fastened to the post by a set screw (not shown); other means such as a magnetic clamp, an electromagnetic clamp, a shape memory alloy clamp, a vacuum clamp, a press fit, and the like may be used to fasten the stud to the post. In addition, and in accordance with one or more such embodiments, each of posts $1540_1$-$1540_4$ is connected or attached to movable walls $1550_1$-$1550_4$ (movable walls $1550_1$-$1550_2$ are shown in FIG. 5A) of a corresponding one of fluid chambers $1560_1$-$1560_4$ (fluid chambers $1560_1$-$1560_2$ are shown in FIG. 5A). In further addition, and in accordance with one or more such embodiments, each of fluid chambers $1560_1$-$1560_2$ contains silicone vacuum pump oil; alternatively the chambers may be filled with a fluid including mineral oil, hydraulic fluid, and the like which will remain fluid over a range of temperatures experienced by test head 3000. In still further addition, and in accordance with one or more such embodiments, each of fluid chambers $1560_1$-$1560_4$ is connected by fluid channels $1570_1$-$1570_4$ (fluid channels $1570_1$-$1570_2$ are shown in FIG. 5A) to common junction 1580 which may be closed by solenoid-operated, spring-return valve 1700. As shown in FIG. 5A, valve 1700 is sealed to support plate 1730 using O-rings 1710-1720.

In accordance with one or more embodiments of the present invention, during a leveling and aligning process, fluid is free to flow in fluid channels $1570_1$-$1570_4$ that interconnect fluid chambers $1560_1$-$1560_4$—central valve 1700 is shown in an open position in FIG. 5A to allow fluid to flow therethrough. In accordance with one or more such embodiments, fluid flows in the network of fluid channels $1570_1$-$1570_4$ to bring pressure within fluid chambers $1560_1$-$1560_4$ into equilibrium. In particular, a downward force applied to one post causes fluid to from the fluid chamber attached to the one post, through channels to the other chambers, thereby acting to tilt test head 3000 downward on a side attached to the one post. Likewise, an upward force on one post acts to tilt test head 3000 upward on a side attached to the one post. After test head 3000 is brought into alignment, shut-off valve 1700 is closed by releasing a magnetic force applied by solenoid 1750 on poppet 1740, thereby trapping fluid within each of fluid chambers $1560_1$-$1560_4$ and fixing the vertical position of each of movable walls $1550_1$-$1550_4$ of each of fluid chambers $1560_1$-$1560_4$ and locking the orientation of test head 3000 attached thereto.

As shown in FIG. 6A, and in accordance with one or more embodiments of the present invention, a force generator applies a downward force to spider plate 1510 and to attached posts $1540_1$-$1540_4$, thereby urging each of movable walls $1550_1$-$1550_4$ attached thereto downward so as to maintain a fluid pressure within each of fluid chambers $1560_1$-$1560_4$. In accordance with one or more embodiments of the present invention, the force generator comprises: Belleville spring 1810 which is held in compression by central screw attachment 1820 (central screw attachment 1820 is screwed into support plate 1835) so as to apply downward force to spider plate 1510 and to attached posts $1540_1$-$1540_4$, thereby urging each of movable walls $1550_1$-$1550_4$ attached thereto downward. In accordance with one or more such embodiments, a baseline of fluid pressure is set by adjustment of screw 1820 so as to reduce the occurrence of bubbles in the fluid, for example and without limitation, silicone oil, due to evolution of dissolved gas. Advantageously, Belleville spring 1810 applies a downward pressure to spider plate 1510 without hindering the tilting motion necessary for alignment of test head 3000.

As shown in FIG. 5A, and in accordance with one or more embodiments of the present invention, alignment and leveling apparatus 1500 comprises four force generators that are upwardly movable so as to engage a bottom surface of test head 3000. In accordance with one or more embodiments of the present invention, the four force generators comprise four pneumatically activated bosses $1830_1$-$1830_4$ (bosses $1830_1$-$1830_2$ are shown in FIG. 5A, and bosses $1830_1$-$1830_4$ are shown in FIG. 6B) that are upwardly movable so as to engage a bottom surface of test head 3000. Air pressures $P_{X2}$, $P_{X1}$, $P_{Y1}$ and $P_{Y2}$ are supplied to four air pockets $1840_1$-$1840_4$, respectively, in support plate 1835, the top of each pocket being sealed by an expandable diaphragm (i.e., diaphragms $1850_1$-$1850_4$ where diaphragms $1850_1$-$1850_2$ are shown in FIG. 5A, and diaphragms $1850_1$-$1850_4$ are shown in FIG. 6B) upon which a boss is mounted (air pockets $1840_1$-$1840_4$ and diaphragms $1850_1$-$1850_4$ may be referred to below as pressure actuators $1890_1$-$1890_4$). As shown in FIG. 5B, and in accordance with one or more such embodiments, air at pressures $P_{X2}$, $P_{X1}$, $P_{Y1}$ and $P_{Y2}$ are applied as input to nozzles $1870_1$-$1870_4$, respectively, from sources of pressurized air (not shown), and channels $1880_1$-$1880_4$ connect nozzles $1870_1$-$1870_4$ to air pockets $1840_1$-$1840_4$.

In accordance with one or more such embodiments of the present invention, each boss may be moved independently by control of air pressure in a corresponding pocket under the boss. For example, a boss may be moved vertically by air pressure so as to contact a back side of test head 3000 and to urge test head 3000 to tilt upward on a side proximal to the boss. After the alignment process is complete, air pressure in each pocket may be released, thereby allowing each boss to retract downward, and out of contact with test head 3000.

Figure 7:
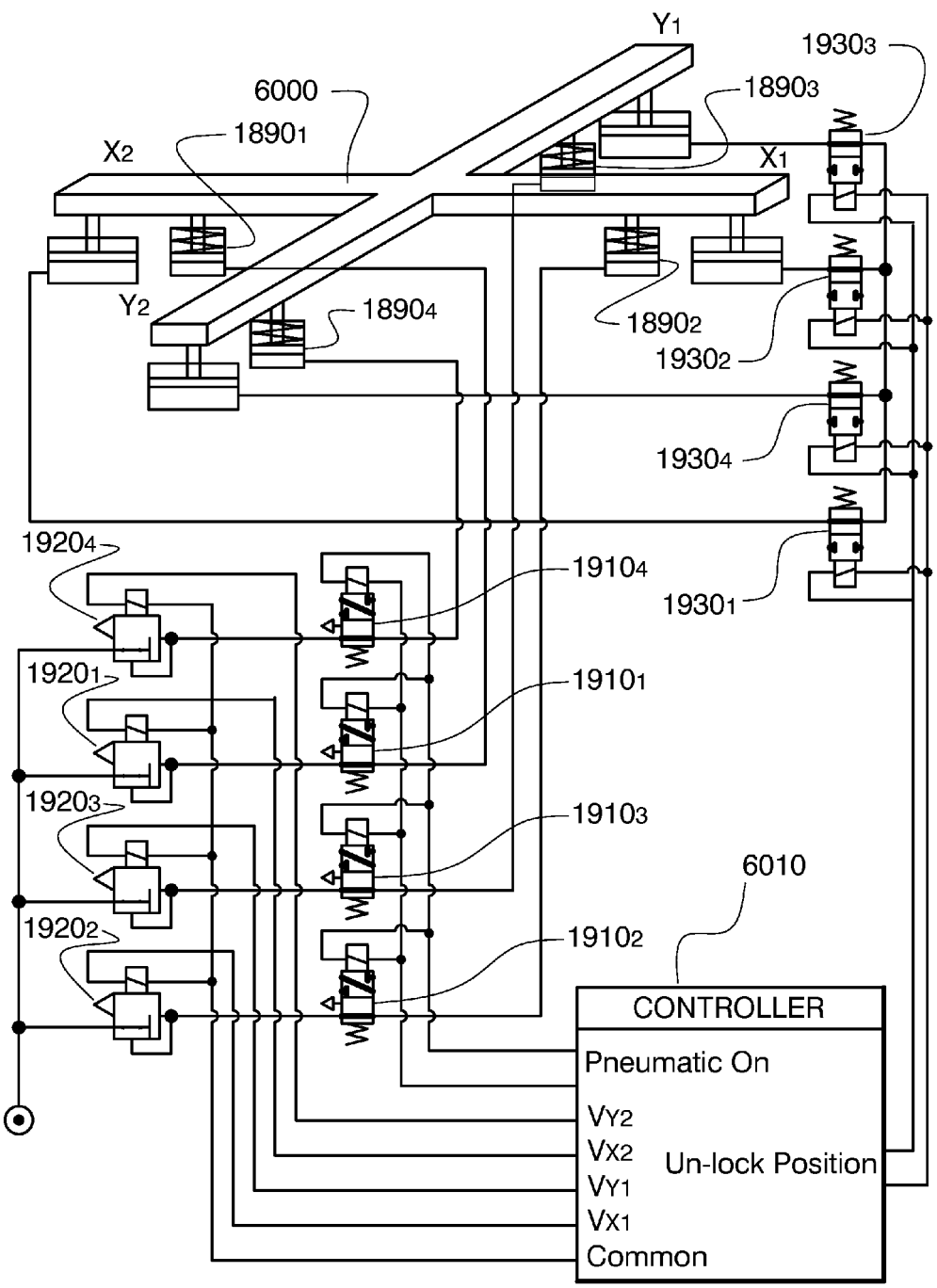
FIG. 7 shows a schematic drawing of the alignment and leveling apparatus shown in FIG. 5A, which drawing is used to help describe its operation.
Figure 8:
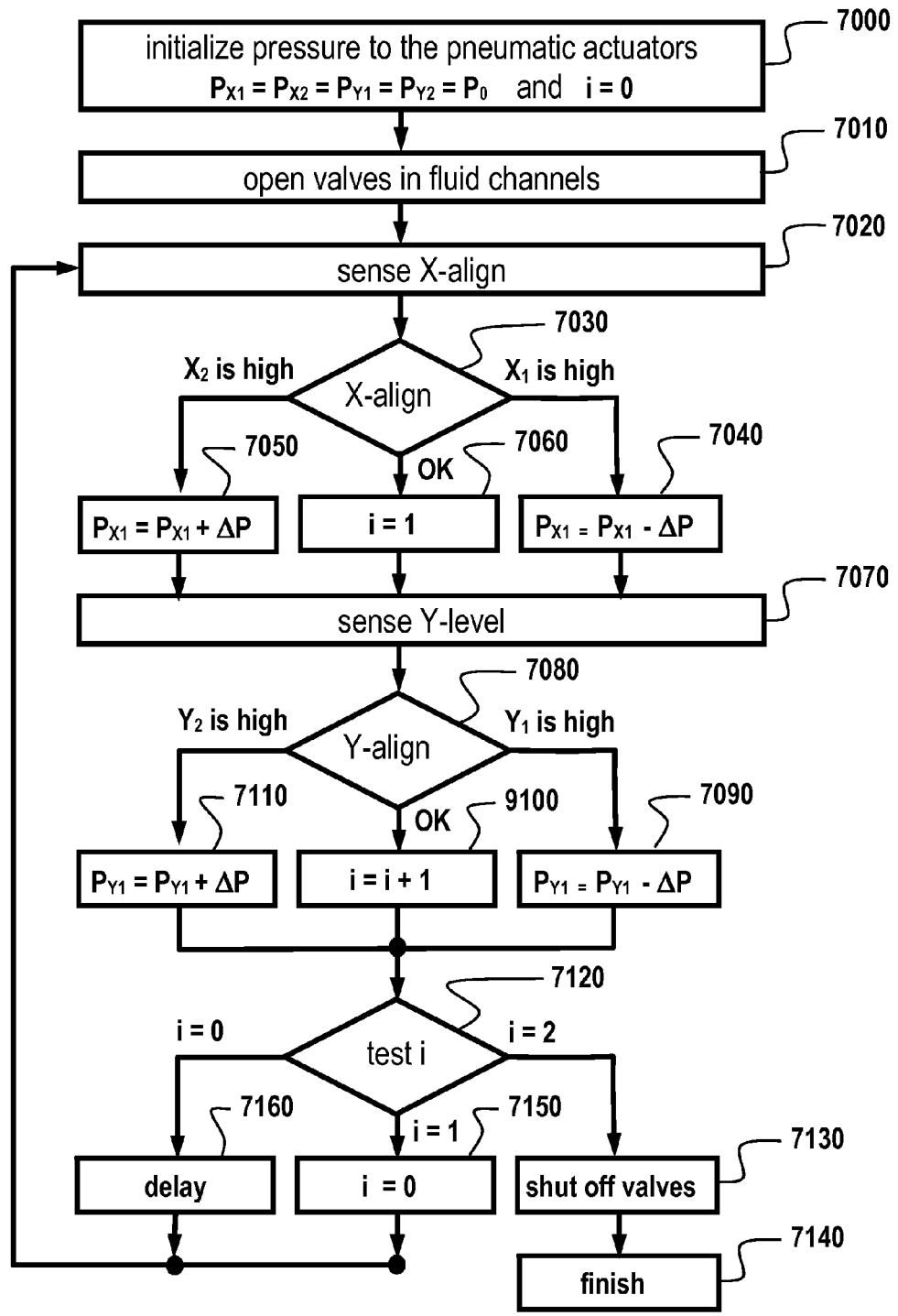
FIG. 8 shows a flow chart of a method for aligning and leveling a test head in accordance with one or more embodiments of the present invention using the alignment and leveling apparatus shown in FIG. 5A.

A process of aligning and leveling a test head in accordance with one or more embodiments of the present invention may be better understood by reference to FIG. 7 (which is a schematic drawing of alignment and leveling apparatus 1500 shown in FIG. 5A) and to FIG. 8 (which is a flow chart of a method for aligning and leveling test head 3000 in accordance with one or more embodiments of the present invention using alignment and leveling apparatus 1500). For simplicity of exposition in FIG. 7, test head 6000 is represented as having arms $X_1$ and $X_2$ disposed along an x-axis and arms $Y_1$ and $Y_2$ disposed along a y-axis, the remainder of test head 6000 being cut away to show the pneumatic actuators and the fluidic chambers of alignment and leveling apparatus 1500 (wherein the pneumatic actuators and the fluidic chambers are each being represented as a fluidic cylinder for of ease of understanding the following).

As shown in FIG. 8, at step 7000, the process of leveling test head 6000 begins by having controller 6010 cause an equal pressure to be applied to each of pneumatic actuators $1890_1$-$1890_4$ (i.e., this initializes the force in the force generators) To do this, pneumatic switches $1910_1$-$1910_4$ are activated by having controller 6010 apply a voltage to each of the solenoids that control pneumatic switches $1910_1$-$1910_4$, and by having controller 6010 apply equal control voltages $V_{X1}$, $V_{Y1}$, $V_{X2}$, and $V_{Y2}$ to each of electronically-controlled, pressure regulators $1920_1$-$1920_4$. As a result, air pressures of $P_{X1}=P_{Y1}=P_{X2}=P_{Y2}$ are applied to pneumatic actuators $1890_1$-$1890_4$, thereby moving bosses $1830_1$-$1830_4$ connected to pneumatic actuators $1890_1$-$1890_4$, respectively, upward into contact with test head 6000. Next, an electronic counter associated with controller 6010 is reset to i=0. Then, control is transferred to step 7010. Such a controller may be fabricated readily by one of ordinary skill in the art utilizing, for example and without limitation, any one of a number of commercially available programmable microprocessors, which microprocessors may be programmed routinely and without undue experimentation utilizing any one of a number of methods that are also well known to those of ordinary skill in the art.

At step 7010 shown in FIG. 8, a position of test head 6000 is unlocked by causing controller 6010 to send signals to shut-off valves $1930_1$-$1930_4$ disposed in fluid channels $1570_1$-$1570_4$ interconnecting fluid chambers $1560_1$-$1560_4$, thereby allowing fluid to flow therebetween (in accordance with the embodiments described here, each fluid channel has a valve). Shut-off valves $1930_1$-$1930_4$ are opened by having controller 6010 apply a voltage to solenoids operating shut-off valves $1930_1$-$1930_4$. For clarity of exposition, shut-off valves $1930_1$-$1930_4$ shown in FIG. 7 are shown as being operated by separate solenoids, whereas in further embodiments, the solenoids may be consolidated into a single solenoid. Whenever shut-off valves $1930_1$-$1930_4$ are held open, an upward force on one side of test head 6000 near arm $Y_1$ will cause fluid to flow into the chamber disposed thereunder and the side proximal to arm $Y_1$ to move upward. Then, control is transferred to step 7020.

At step 7020 shown in FIG. 8, i.e., after unlocking the position of test head 6000, an X-level is sensed by, for example and without limitation, a pattern of electrical contacts arrayed between a surface of test head 6000 and a surface of a work piece (not shown). Then, control is transferred to decision step 7030.

At decision step 7030 shown in FIG. 8, electronic decision-making circuitry in controller 6010 branches depending on whether the sensed X-level indicates that a position of arm $X_1$ is higher than, lower than, or equal to a position of arm $X_2$ (i.e., equal to within a predetermined tolerance). If the sensed X-level indicates that the position of arm $X_1$ is higher than the position of arm $X_2$, control is transferred to step 7040; if the sensed X-level indicates that the position of arm $X_1$ is lower than the position of arm $X_2$, control is transferred to step 7050; and if the sensed X-level indicates that the position of arm $X_1$ is equal to the position of arm $X_2$, control is transferred to step 7060.

At step 7040 shown in FIG. 8, the electronic decision-making circuitry causes controller 6010 to decrease voltage $V_{X1}$ applied to electronically-controlled, pressure regulator $1920_4$, thereby decreasing pneumatic pressure to pneumatic actuator $1890_4$ and relaxing test head 6000 downward on the side of test head 6000 proximal to arm $X_1$. Electronic decision-making circuitry suitable for this purpose can be fabricated in accordance with any one of a number of methods that are well known to those of ordinary skill in the art. For example and without limitation, such electronic decision-making circuitry may be fabricated utilizing logic circuitry, software controlled circuitry, or a combination thereof. Then, control is transferred to step 7070.

At step 7050 shown in FIG. 8, the electronic decision-making circuitry causes controller 6010 to increase voltage $V_{X1}$, thereby increasing pneumatic pressure to pneumatic actuator 1890₄ and urging test head 6000 upward on the side of test head 6000 proximal to arm $X_1$. Then, control is transferred to step 7070.

At step 7060 shown in FIG. 8, the electronic decision-making circuitry causes controller 6010 to set indicator i to i=1. Then, control is transferred to step 7070.

At step 7070 shown in FIG. 8, a Y-level is sensed by, for example and without limitation, a pattern of electrical contacts arrayed between a surface of test head 6000 and a work piece (not shown). Then, control is transferred to decision step 7080.

At decision step 7080 shown in FIG. 8, electronic decision-making circuitry in controller 6010 branches depending on whether the sensed Y-level indicates that a position of arm $Y_1$ is higher than, lower than, or equal to a position of arm $Y_2$ (i.e., equal to within a predetermined tolerance). If the sensed Y-level indicates that the position of arm $Y_1$ is higher than the position of arm $Y_2$, control is transferred to step 7090; if the sensed Y-level indicates that the position of arm $Y_1$ is lower than the position of arm $Y_2$, control is transferred to step 7110; and if the sensed Y-level indicates that the position of arm $Y_1$ is equal to the position of arm $Y_2$, control is transferred to step 7100.

At step 7090 shown in FIG. 8, the electronic decision-making circuitry causes controller 6010 to decrease voltage $V_{Y1}$ applied to electronically-controlled, pressure regulator 1920₃, thereby decreasing pneumatic pressure to pneumatic actuator 1890₃ and relaxing test head 6000 downward on the side of test head 6000 proximal to arm $Y_1$. Then, control is transferred to decision step 7120.

At step 7110 shown in FIG. 8, the electronic decision-making circuitry causes controller 6010 to increase voltage $V_{Y1}$, thereby increasing pneumatic pressure to pneumatic actuator 1890₃ and urging test head 6000 upward on the side of test head 6000 proximal to arm $Y_1$. Then, control is transferred to decision step 7120.

At step 7100 shown in FIG. 8, the electronic decision-making circuitry causes controller 6010 to set indicator i to i=i+1. Then, control is transferred to decision step 7120.

At decision step 7120 shown in FIG. 8, decision making circuitry in controller 6010 transfers control depending on the value of indicator i. In particular, if i=2 (indicating that test head 6000 is level in the X-direction and in the Y-direction), control is transferred to step 7130; if i=1, control is transferred to step 7150; and if i=0, control is transferred to step 7160.

At step 7130 shown in FIG. 8, controller 6010 sends signals to cause shut-off valves 1930₁-1930₄ in fluid channels 1570₁-1570₄ to be closed, thereby locking test head 6000 in a leveled position. Then, control is transferred to step 7140.

At step 7140 shown in FIG. 8, the leveling process is finished.

At step 7150 shown in FIG. 8, the electronic decision-making circuitry causes controller 6010 to set indicator i to i=0. Then, control is transferred to step 7020 to sense the X-level.

At step 7160 shown in FIG. 8, the electronic decision-making circuitry causes controller 6010 to delay to allow more time for fluid to flow in fluid channels 1570₁-1570₄. Then, control is transferred to step 7020 to sense the X-level.

In accordance with one or more embodiments of the present invention, a multiplicity of test heads may be leveled, and the test heads may be aligned, one to another. In particular, FIGS. 9A-9D show alignment and leveling apparatus 8000 which is fabricated in accordance with one or more embodiments of the present invention for leveling and aligning four independent segments of test head 8010, the four segments 8010₁-8010₄ being best illustrated in a top sectional view of alignment and leveling apparatus 8000 shown in FIG. 9D, which section is taken in a plane indicated by arrows G and G' of FIG. 9C.

Figure 9A:
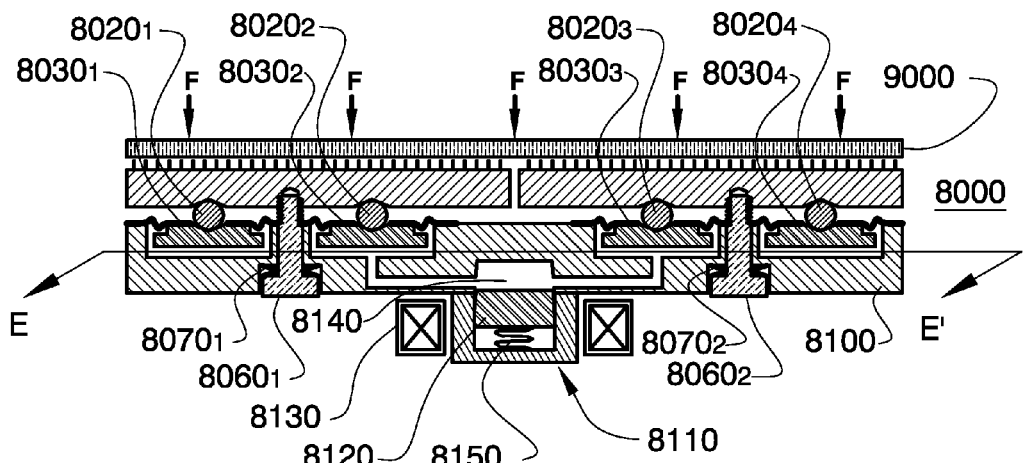
FIG. 9A is a cross-sectional view of an alignment and leveling apparatus that is fabricated in accordance with one or more embodiments of the present invention for aligning and leveling a test head comprising of multiple segments.
Figure 9B:
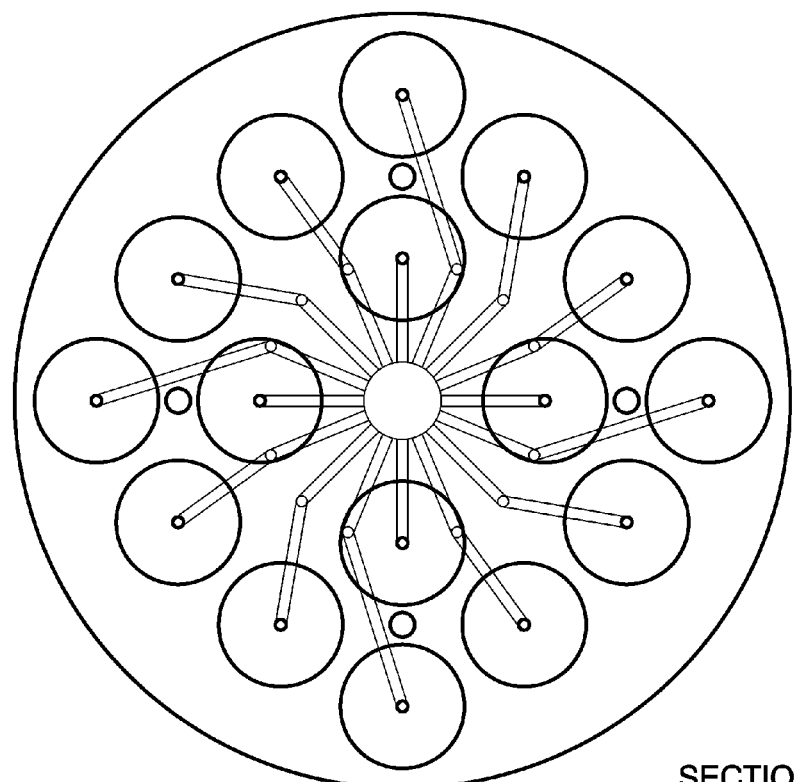
FIG. 9B is a top sectional view of the alignment and leveling apparatus shown in 9A.
Figure 9C:
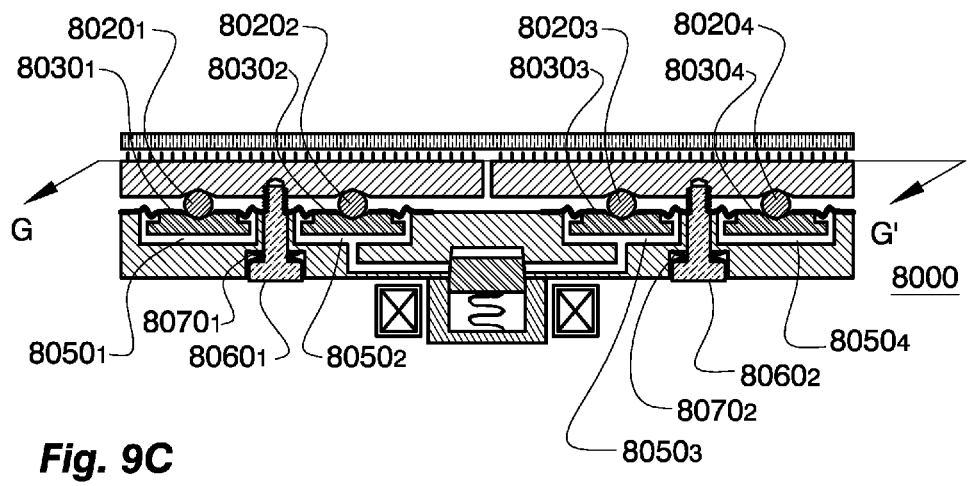
FIG. 9C is a cross-sectional view of the alignment and leveling apparatus shown in FIG. 9A in a locked configuration.
Figure 9D:
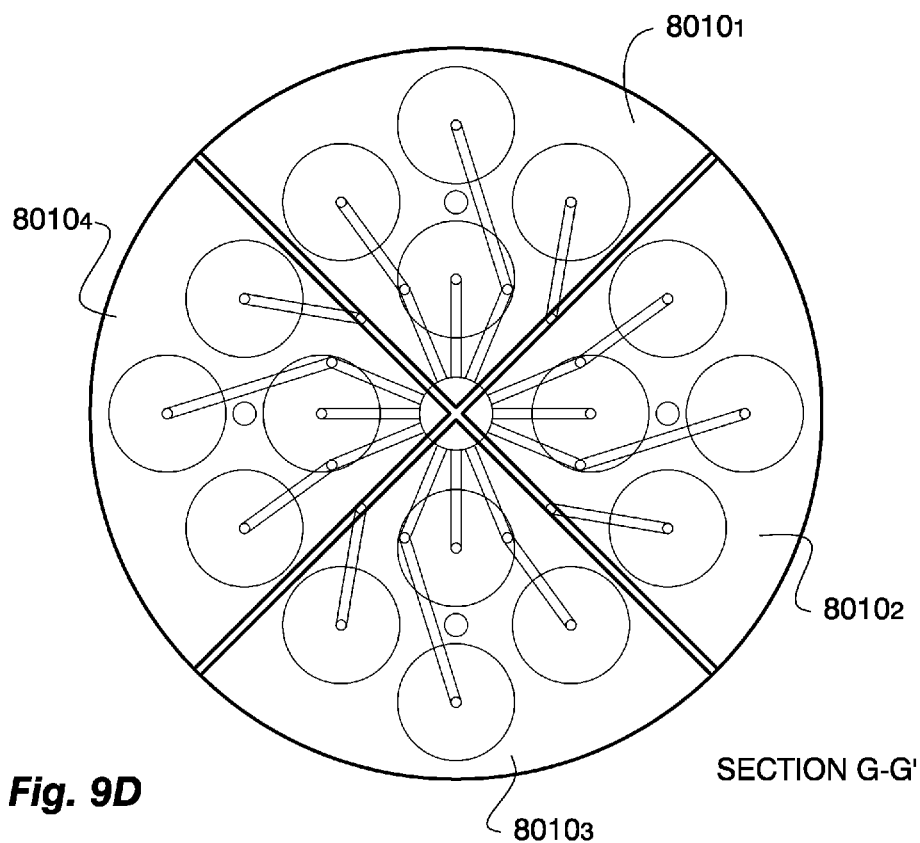
FIG. 9D is a top sectional view of the alignment and leveling apparatus shown in 9C.

As indicated in FIGS. 9A-9D, each of segments 8010₁-8010₄ of test head 8010 is supported on four balls (balls 8020₁-8020₄ are shown in FIGS. 9A and 9C) wherein each of the balls rests on a movable wall (movable walls 8030₁-8030₄ are shown in FIGS. 9A and 9C) of a corresponding fluid chamber (fluid chambers 8050₁-8050₄ are shown in FIGS. 9A and 9C). In addition, in accordance with one or more embodiments of the present invention, each of segments 8010₁-8010₄ is secured in place by a bolt which is: (a) inserted through support plate 8100; (b) threaded into the segment; and (c) held in tension by a Belleville spring (bolts 8060₁-8060₂ and Belleville springs 8070₁-8070₂ are shown in FIGS. 9A and 9C). In further addition, in accordance with one or more such embodiments, the Belleville springs are designed to have a large dynamic range such that the spring exerts a downward force on a test head segment that is relatively constant over a typical range of vertical motion of the test head segment. By way of example, a stack of two (2) Belleville springs may be used to provide a force that is within 10% of the maximum force over a range of motion of 500 microns. While Belleville springs may have desirable properties in that they may be designed to have a nearly constant force vs. displacement, other attachment methods may be used including without limitation helical springs, cone springs, leaf springs, wave springs, magnetic holders, electromagnetic catches, and the like. In accordance with one or more alternative embodiments of the present invention, the ball supports disposed under each segment of test head 8010 may be replaced by any one of a number of other suitable mechanisms such as, for example and without limitation, solid posts, wherein the posts are the means of attachment of the segment to the array of movable walls of the fluid chambers, thereby eliminating a need for the bolt and the Belleville spring as an attachment means.

As further shown in FIGS. 9A-9C, alignment and leveling apparatus 8000 further comprises fluid chambers 8050₁-8050₁₆, each with a movable top wall, that are disposed in a surface of support plate 8100. As further shown in FIGS. 9A and 9C, attachment bolts (attachment bolts 8060₁-8060₂ are shown in FIGS. 9A and 9C) are disposed in holes through support plate 8100, wherein each bolt is preferably located under an area centroid of a test head segment attached thereto. Further, as has been described above, each of segments 8010₁-8010₄ of test head 8010 is supported on four balls (balls 8020₁-8020₄ are shown in FIGS. 9A and 9C), wherein each of the balls rests on a movable wall (movable walls 8030₁-8030₄ are shown in FIGS. 9A and 9C) of a corresponding fluid chamber (fluid chambers 8050₁-8050₄ are shown in FIGS. 9A and 9C). In addition, and in accordance with one or more such embodiments, the balls supporting a segment of test head 8010 are arrayed around an attachment bolt attaching the segment to support plate 8100. Thus, in accordance with one or more such embodiments, each of the four segments 8010₁-8010₄ of test head 8010 are supported by interposition of four balls on four movable walls of four fluid chambers. In further addition, each of sixteen fluid chambers fluid chambers 8050₁-8050₁₆ are each connected by a fluid channel to central shut-off valve 8110. Whenever shut-off valve 8110 is open (as shown FIG. 9A), fluid in each chamber is free to flow to other chambers.

A method for leveling each of segments 8010₁-8010₄ of test head 8010 and aligning the segments, one to another, is best understood by reference to the cross-sectional view of alignment and leveling apparatus 8000 shown in FIG. 9A, and the top sectional view of alignment and leveling apparatus 8000 shown in FIG. 9B, which section is taken in a plane indicated by arrows E and E' of FIG. 9A. In accordance with one or more embodiments of the present invention, during the leveling and aligning process, a controller (not shown) sends a signal to electromagnetic mechanism 8130 (for example and without limitation, a solenoid) of shut-off valve 8110 is cause plug 8120 to be drawn downward, thereby opening fluid channels from each chamber to common manifold 8140 and enabling fluid in each chamber to flow to other chambers via manifold 8140. Such a controller may be fabricated readily by one of ordinary skill in the art utilizing, for example and without limitation, any one of a number of commercially available programmable microprocessors, which microprocessors may be programmed routinely and without undue experimentation utilizing any one of a number of methods that are also well known to those of ordinary skill in the art. In accordance with one or more such embodiments, plug 8120 may have a through-hole, from top to bottom, that allows fluid trapped in manifold 8140 to relieve through plug 8120 as plug 8120 is drawn downward. Next, test piece 9000 is urged downward against electrical probes arrayed on a top surface of each of segments 8010₁-8010₄ of test head 8010 by a distribution of forces F. In accordance with one or more embodiments of the present invention, fluid flows in the fluid channels to equalize pressure in the fluid chambers. When the fluid pressure within all of the fluid chambers is equal, and the forces on each of segments 8010₁-8010₄ of test head 8010 are equal, segments 8010₁-8010₄ are in alignment. Then, shut-off valve 8110 is closed by having the controller send a signal to release electromagnetic mechanism 8130, thereby allowing spring 8150 to move plug 8120 upward into manifold 8140, thereby closing off each of the channels leading from manifold 8140 to a corresponding fluid chamber. As the volume of fluid in each chamber is fixed when shut-off valve 8110 is closed, each of segments 8010₁-8010₄ of test head 8010 supported by each chamber is locked in a level position by closing shut-off valve 8110.

Preferably, the fluid in the fluid chambers is relatively incompressible so as to maintain the position of test head segments, notwithstanding a variable force transmitted to the test head segments by a test piece. More preferably, the fluid is a low vapor pressure liquid such as silicone vacuum pump oil supplied by Dow Corning. Alternatively, the fluid is selected from a group, for example and without limitation, of hydraulic fluid, mineral oil, aliphatic oil, chlorinated hydrocarbon oils, Galden (available from Solvay Chemical), Fluorinert (available from 3M Corporation), and the like.

As will be appreciated by one of ordinary skill in the art, the principles described above pertaining to various embodiments of the present invention may be used to design leveling and aligning apparatus that disposes fluid chambers in various combinations. By way of example, each segment of a test head may be supported on movable walls of a first set of fluid chambers in a first support plate. In turn, each of a group of first support plates may be supported on movable walls of a second set of fluid chambers in a second support plate. In addition, during a process of leveling and aligning segments of a test head, fluid may be allowed to flow between fluid chambers of a first set of fluid chambers by means of a first set of fluid channels; and fluid may be allowed to flow between fluid chambers of a second set of fluid chambers by means of a second set of fluid channels. Further, when segments of a test head are level and aligned, fluid flow in the first set of channels may be shut off by one or more valves, and fluid flow in the second set of channels may be shut off by one or more valves, thereby locking segments of the test head in alignment.

Embodiments of the present invention described above are exemplary. As such, many changes and modifications may be made to the disclosure set forth above while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Further, as is apparent to one skilled in the art, the embodiments may be used for making connections to semiconductor devices, electronic devices, electronic subsystems, cables, and circuit boards and assemblies.

As one or ordinary skill in the art will readily appreciate, sockets fabricated in accordance with one or more embodiments of the present invention may include any number of fluid seals, gaskets, adhesives, washers, or other elements that function to seal the assembly and to prevent thermal transfer fluid from leaking (internally or externally).

The scope of the invention should be determined with reference to the appended claims along with their full scope of equivalents.

What is claimed is:

1. A method for aligning a first workpiece to a second work piece that comprises:
   placing the first workpiece on an alignment apparatus comprising:
   (a) two or more fluid chambers disposed in fixed relation to each other, the chambers having a movable wall and one or more apertures for admitting or releasing fluid;
   (b) fluid channels coupled to the one or more apertures that enable fluid to flow between at least two of the fluid chambers; and
   (c) one or more valves disposed to enable or to stop the flow of fluid through one or more of the one or more fluid channels;
   pumping incompressible fluid into the fluid chambers;
   opening the one or more valves;
   bringing the first and second workpieces into contact;
   waiting a predetermined time for fluid flow in the fluid channels;
   determining whether the first and second workpieces are aligned;
   if they are aligned, shutting the valves; and
   if they are not aligned, moving the second workpiece a predetermined amount in a predetermined direction, and returning to waiting.

2. The method of claim 1 wherein the chambers are disposed in a plate.

3. The method of claim 1 wherein the chambers are disposed in a plate and a test head is mechanically connected to the movable wall of the chambers.

4. The method of claim 3 wherein the mechanical connection comprises one or more pillars connected to the movable wall of the chambers.

5. The method of claim 3 wherein the movable wall comprises a top surface of the fluid chambers.

6. The method of claim 1 wherein the fluid channels are directed through a common junction.

7. The method of claim 6 wherein the one or more valves include a valve at the common junction.

8. The method of claim 1 wherein one of the one or more fluid channels is directed between a pair of fluid chambers.

9. The method of claim 1 wherein the one or more valves operate in response to a controller.

10. The method of claim 1 wherein:
the two or more fluid chambers comprise three fluid chambers;
the fluid channels comprise three fluid channels that each connect a pair of fluid chambers; and
the one of more valves comprise a valve disposed in each of the three fluid channels.

11. The method of claim 1 wherein:
the two or more fluid chambers comprise four fluid chambers;
the fluid channels comprise two fluid channels that each connect a pair of fluid chambers; and
the one of more valves comprise a valve disposed in each of the two fluid channels.

12. The method of claim 1 wherein:
one or more of the two or more fluid chambers has a movable wall that comprises a movable top surface.

13. The method of claim 12 wherein the movable top surface comprises a diaphragm.

14. The method of claim 1 wherein:
one or more of the two or more fluid chambers has a movable wall that comprises a movable bottom surface.

15. The method of claim 14 wherein:
a mechanical connection between a test head and the movable bottom surface.

* * * * *